US009410989B2

(12) United States Patent
Weller

(10) Patent No.: US 9,410,989 B2
(45) Date of Patent: Aug. 9, 2016

(54) OSCILLOSCOPE WITH INTEGRATED GENERATOR AND INTERNAL TRIGGER

(75) Inventor: Dennis J. Weller, Colorado Springs, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 641 days.

(21) Appl. No.: 13/091,478

(22) Filed: Apr. 21, 2011

(65) Prior Publication Data

US 2012/0268101 A1 Oct. 25, 2012

(51) Int. Cl.
| | |
|---|---|
| G01R 19/00 | (2006.01) |
| G01R 23/16 | (2006.01) |
| G01R 13/00 | (2006.01) |
| G01R 13/02 | (2006.01) |

(52) U.S. Cl.
CPC ........ *G01R 13/0218* (2013.01); *G01R 13/0254* (2013.01)

(58) Field of Classification Search
CPC ............. G01R 13/0254; G01R 35/002; G01R 13/0218
USPC ................. 324/76.11, 76.22; 702/66, 67, 189
See application file for complete search history.

(56) References Cited

U.S. PATENT DOCUMENTS

| | | | | |
|---|---|---|---|---|
| 4,564,805 | A | * | 1/1986 | Winter ...................... 324/121 R |
| 4,585,975 | A | * | 4/1986 | Wimmer ...................... 315/307 |
| 5,184,062 | A | * | 2/1993 | Ladwig ........................... 324/74 |
| 7,072,781 | B1 | * | 7/2006 | Gershon et al. ................. 702/63 |
| 7,271,575 | B2 | * | 9/2007 | Pickerd et al. ............. 324/76.19 |
| 7,723,978 | B2 | | 5/2010 | Caffrey et al. |

OTHER PUBLICATIONS

Instek GOS-620FG. Data Sheet [online]. Good Will Instrument Co., Ltd., [retrieved on Nov. 1, 2011, and was publicly available as of the U.S. filing date of the application]. Retrieved from the Internet: <URL: https://www.testequipmentdepot.com/instek/pdf/GOS-620FG.pdf>.
Tonghui TDO3000 series, "Digital Storage Oscilloscope." Data Sheet, pp. 2-7 [online]. Changzhou Tonghui Electronics, Co., Ltd., [retrieved on Nov. 1, 2010, and was publicly available as of the U.S. filing date of the application]. Retrieved from the Internet: <URL: https://www.globalmediapro.com/att/a/2/b/3/a2b3i0/tdo3000.pdf>.
Tonghui TDO3000 series, "The perfect group of Digital Storage Oscilloscope, Function/Arbitrary Waveform Generator." Brochure, pp. 1-8 [online]. Changzhou Tonghui Electronics, Co., Ltd., [retrieved on Nov. 1, 2011, and was publicly available as of the U.S. filing date of the application]. Retrieved from the Internet: <URL: http://www.tonghui.com.cn/en/Product/digital%20storage%20oscilloscope/370.html>.

(Continued)

Primary Examiner — Amy He

(57) ABSTRACT

An apparatus, includes an oscilloscope and a waveform generator. The waveform generator is integrated in a common housing with the oscilloscope, and configured to provide a stimulus signal as an output of the apparatus and to provide a trigger signal that is connected internally to the oscilloscope for triggering the oscilloscope.

20 Claims, 5 Drawing Sheets

(56) References Cited

OTHER PUBLICATIONS

Instek GOS-620FG, "20MHz Dual Trace Oscilloscope with Function Generator." User Manual, pp. 1-34, [online]. Good Will Instrument Co., Ltd., [retrieved on Nov. 1, 2010, and was publicly available as of the U.S. filing date of the application]. Retrieved from the Internet: <URL: http://www.gwinstek.com/en-global/products/Oscilloscopes/Analog_Oscilloscopes/GOS-630_GOS-620>.

PicoScope 6000 Series PC Oscilloscopes, User's Guide, pp. 1-20, [online]. Pico Technology, Ltd., 2009, [retrieved on Jan. 25, 2011]. Retrieved from the Internet: <URL: http://www.picotech.com/downloads>.

PicoScope 6000 Series PC Oscilloscopes, Programmer's Guide, pp. 1-102, [online]. Pico Technology, Ltd., 2009, [retrieved on Jan. 25, 2011]. Retrieved from the Internet: <URL: http://www.picotech.com/downloads>.

PicoScope 6 PC Oscilloscope Software, User's Guide, pp. 1-172, [online]. Pico Technology, Ltd., 2007-2010, [retrieved on Jan. 25, 2011]. Retrieved from the Internet: <URL: http://www.picotech.com/downloads>.

\* cited by examiner

OSCILLOSCOPE WITH INTEGRATED GENERATOR AND INTERNAL TRIGGER

BACKGROUND

Oscilloscopes and waveform generators are common instruments used by electrical engineers and technicians. Often both instruments are used together. For example, the waveform generator can provide a stimulus signal to a device-under-test (DUT), and the oscilloscope can subsequently measure or display the output signals provided by the DUT responsive to the stimulus signal. The oscilloscope can also be triggered by the waveform generator.

In general, the oscilloscope and the waveform generator are provided independent of each other. In some cases, the oscilloscope and the waveform generator may be disposed within a same housing. In either case however, the oscilloscope operates independently of the waveform generator. A limitation of this arrangement is that to trigger the oscilloscope responsive to the waveform generator, external cables are relied upon to connect to an output of the waveform generator and to an input of the oscilloscope. Typically, a signal splitter is attached to the output of the waveform generator, and a first output of the signal splitter is attached to the DUT and a second output of the signal splitter may be connected to an external trigger or auxiliary input of the oscilloscope, for example. The signal splitter however reduces the signal amplitude of the waveform generator output available to the DUT, e.g., by as much as 6 dB, which results in a lower quality signal provided to the oscilloscope. Also, because one of the inputs on the oscilloscope must be used to receive the trigger from the waveform generator, the total number of inputs on the oscilloscope available for measurement of signals from the DUT is reduced, which limits how the oscilloscope may be used.

What is needed, therefore, is an apparatus that overcomes at least the shortcomings of known oscilloscopes described above.

SUMMARY

In a representative embodiment, an apparatus comprises an oscilloscope; and a waveform generator integrated in a common housing with the oscilloscope, and configured to provide a stimulus signal as an output of the apparatus and to provide a trigger signal that is connected internally to the oscilloscope for triggering the oscilloscope.

In another representative embodiment, an apparatus comprises a plurality of channel input blocks configured to receive input signals; an acquisition system configured to display the input signals; a waveform generator integrated in a common housing with the acquisition system, and configured to provide a stimulus signal as an output of the apparatus and to provide a trigger signal; and a switch integrated in the common housing and connected internally to the waveform generator and the channel input blocks, and configured to selectively provide the input signals and the trigger signal to the acquisition system to trigger display of the input signals.

In another representative embodiment, a method of triggering an apparatus having an oscilloscope and a waveform generator integrated within a common housing, comprises generating a trigger signal using the waveform generator; internally connecting the trigger signal to the oscilloscope; and triggering display of a signal by the oscilloscope responsive to the trigger signal.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
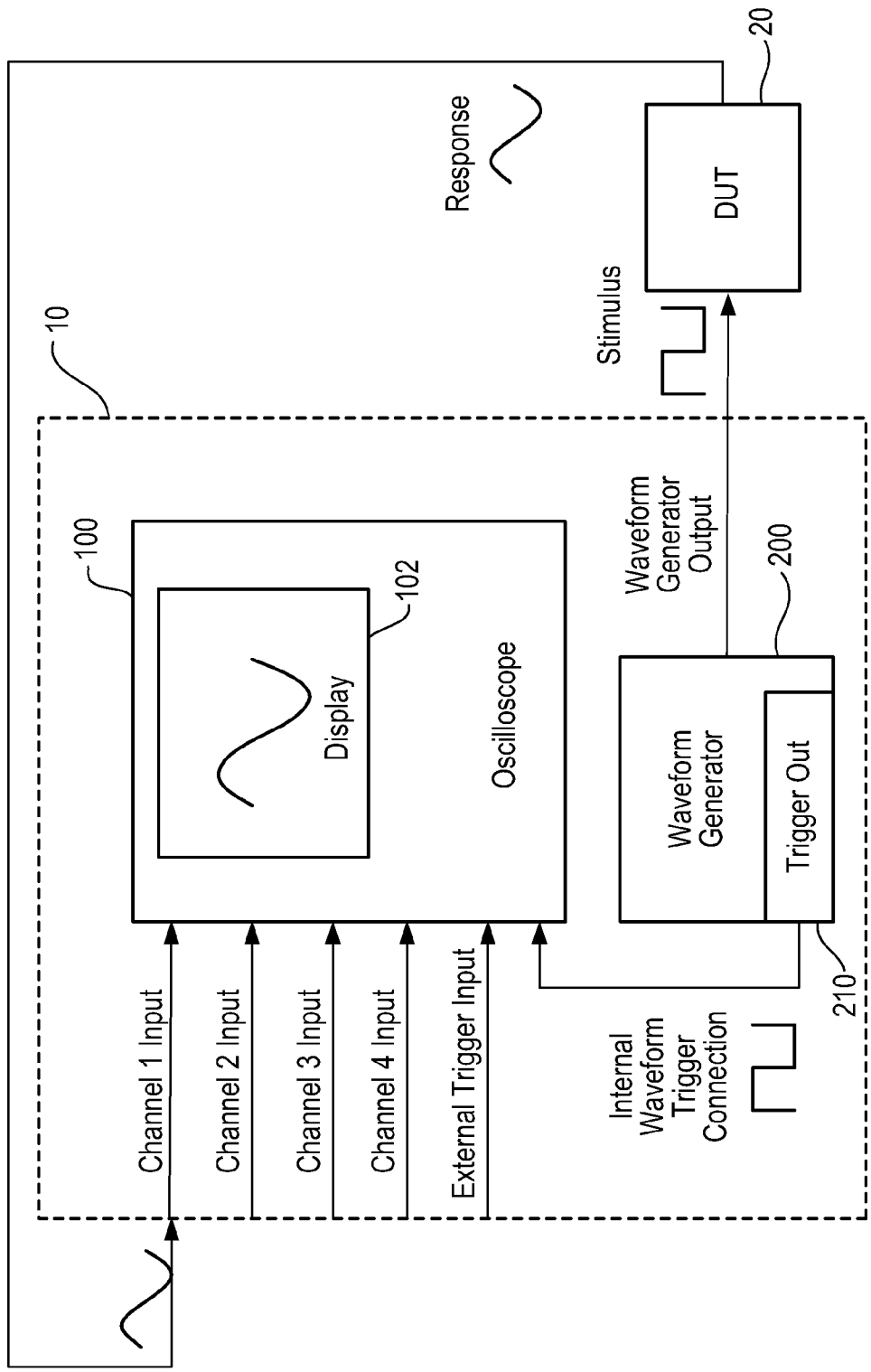
FIG. 1 is a block diagram illustrating an apparatus with an integrated waveform generator that provides an internal waveform trigger for the oscilloscope according to a representative embodiment.

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings.

Generally, it is understood that the drawings and the various elements depicted therein are not drawn to scale. Further, relative terms, such as "above," "below," "top," "bottom," "upper," "lower," "left," "right," "vertical" and "horizontal," are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be "below" that element. Likewise, if the device were rotated 90 degrees with respect to the view in the drawings, an element described as "vertical," for example, would now be "horizontal."

FIG. 1 is a block diagram illustrating an apparatus with an integrated waveform generator that provides an internal waveform trigger for the oscilloscope according to a representative embodiment.

Referring to FIG. 1, the apparatus comprises oscilloscope 100 and integrated waveform generator 200 disposed within common housing 10. Oscilloscope 100 may receive up to four channel input signals at corresponding channel inputs, shown as channel input signals 1-4, which may each be non-repetitive analog waveforms, repetitive analog waveforms, non-repetitive digital waveforms or repetitive digital waveforms provided externally from outside common housing 10. Oscilloscope 100 may also receive an external trigger signal at an external trigger input provided externally from outside common housing 10. Oscilloscope 100 is a digital sampling oscilloscope that digitizes channel input signals 1-4, and displays the digitized channel input signals on display 102 which may be a computer screen. Display 102 may be built-in or external from common housing 10. Although oscilloscope 100 is described as a digital sampling oscilloscope, in other representative embodiments, oscilloscope 100 may be an analog oscilloscope.

Integrated waveform generator 200 provides a waveform generator output or stimulus signal ("stimulus signal") such as a square wave to the external outside of common housing 10. Device-under-test (DUT) 20 receives the stimulus signal, and responsive thereto provides a test output signal which may be analog or digital, and which is input as channel input signal 1, for example, to oscilloscope 100 of common housing 10. Integrated waveform generator 200 comprises a trigger out block 210 that generates and provides an internal waveform trigger signal directly to oscilloscope 100. Oscilloscope 100 uses either of the external trigger input signal or the internal waveform trigger signal to determine what portion of the digitized channel input signals are displayed. Alternatively, the oscilloscope 100 may use one of the channel input signals 1-4 as a trigger signal. In an embodiment, the source of the input signal is selectable via an internal trigger source switch (not shown in FIG. 1), discussed below.

Figure 2:
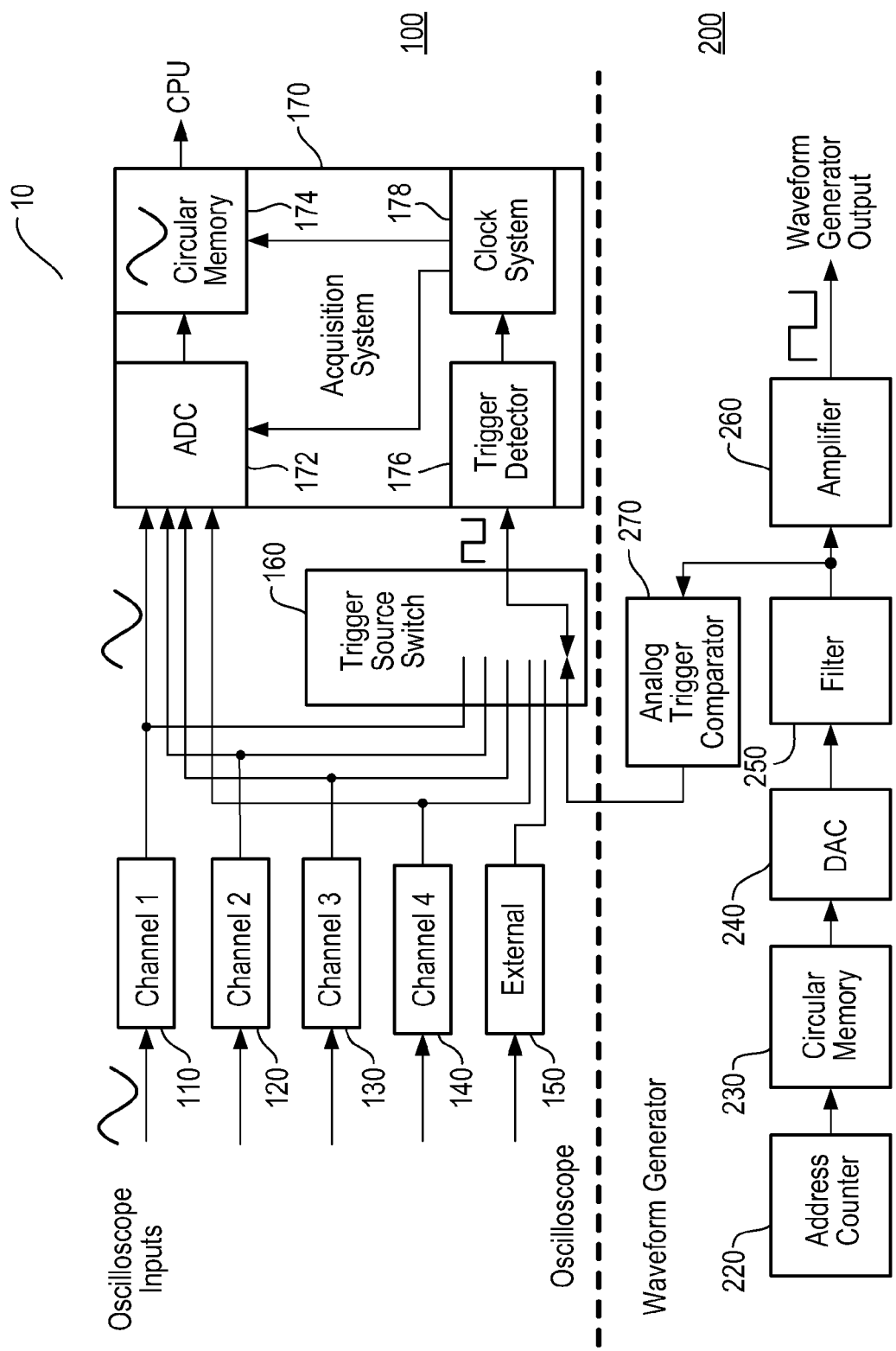
FIG. 2 is a block diagram illustrating an apparatus with an integrated direct digital synthesis (DDS) waveform generator including an analog trigger comparator that provides an internal waveform trigger for the oscilloscope according to a representative embodiment.

FIG. 2 is a block diagram illustrating an apparatus with an integrated direct digital synthesizer (DDS) waveform generator including an analog trigger comparator that provides an internal waveform trigger for the oscilloscope according to a representative embodiment. The apparatus comprises oscilloscope 100 and integrated waveform generator 200 separated by a dashed line within common housing 10. DUT 20 is omitted from FIG. 2 for the sake of simplification.

Referring to FIG. 2, integrated waveform generator 200 is a DDS waveform generator including address counter 220, circular memory 230, digital-to-analog converter (DAC) 240, filter 250, amplifier 260 and analog trigger comparator 270. Analog trigger comparator 270 may correspond to trigger out block 210 shown in FIG. 1. A waveform such as a square wave is stored as digital samples in circular memory 230. Digitized samples of other types of waveforms may be stored in circular memory 230. Address counter 220 provides output addresses to circular memory 230 to control output of the digitized samples within circular memory 230. The digitized samples output from circular memory 230 are converted to an analog signal by DAC 240. The analog signal output from DAC 240 is respectively filtered and then amplified in filter 250 and amplifier 260, to provide the waveform generator output signal. Analog trigger comparator 270 is connected to filter 250, and monitors the filter output to detect a trigger event on the filtered analog signal. For instance, analog trigger comparator 270 may be configured to provide a trigger signal responsive to detection of the filtered analog signal output from filter 250 being greater than the threshold of analog trigger comparator 270. The threshold of the analog trigger comparator 270 is preset to be between the minimum and maximum voltages of the filtered analog signal. For example, if the filtered analog signal is a square wave spanning −1 volt to +1 volts, the threshold of the analog trigger comparator 270 may be set to 0 volts. Thus, when the filtered analog signal transitions from −1V to +1V, the analog trigger comparator 270 will detect the transition and provide the trigger signal to oscilloscope 100. The trigger event itself can be user selectable. The trigger signal is output from integrated waveform generator 200 as the internal waveform trigger signal and internally connected to oscilloscope 100.

Referring further to FIG. 2, oscilloscope 100 comprises first channel input block 110, second channel input block 120, third channel input block 130, fourth channel input block 140, external block 150, trigger source switch 160 and acquisition system 170. Channel input blocks 110, 120, 130 and 140 are configured to respectively receive the channel input signals 1-4 shown in FIG. 1. Channel input blocks 110, 120, 130 and 140 each include attenuators and amplifiers that scale channel input signals 1-4 having amplitude within a range of about 2-3 millivolts to about 40 volts to a typical normalized amplitude of about 0.5 volts. Channel input blocks 110, 120, 130 and 140 are each respectively shown as providing the processed input signals to both acquisition system 170 and trigger source switch 160. Although only a single output is shown from each of channel input blocks 110, 120, 130 and 140 for the sake of simplicity, each of the channel input blocks 110, 120, 130 and 140 may provide respectively different signals to both acquisition system 170 and trigger source switch 160. In the case where the channel input signals are analog as shown in FIG. 2, the processed channel input signals 1-4 with scaling are provided to acquisition system 170. To be useful as trigger signals, the processed input signals must be converted (digitized) to a digital signal either by respective comparators located in the channel input blocks 110, 120, 130, and 140, or alternatively by a comparator located in the trigger detector 176. In the case that comparators are located in the channel input blocks, the digitized signals are provided as the respective outputs of channel input blocks 110, 120, 130 and 140 to trigger source switch 160. In the case that a comparator is located in the trigger detector 176, the processed input signals are provided as the respective outputs of channel input blocks 110, 120, 130 and 140 to trigger source switch 160. Typically, oscilloscopes may include 2 or 4 channel input blocks. Thus, oscilloscope 100 may include more or less than the four channel input blocks depicted in FIG. 2, and should not be limited as including four channel input blocks.

External block 150 is configured to receive the external trigger signal, and provides processing somewhat similar as performed by the channel input blocks 110, 120, 130 and 140 on the channel input signals 1-4, however scaling the external trigger signal to a lesser range of amplitudes. In the alternative, external block 150 may be configured to provide no scaling. The output of external block 150 is used as a trigger reference point. The processed external trigger signal is provided to trigger source switch 160. To be useful as trigger signal, the external trigger signal must be converted (digitized) to a digital signal by either a comparator located in external block 150, or alternatively by a comparator located in trigger detector 176. In the case that a comparator is located in external block 150, the digitized signal is provided as the output of external block 150 to trigger source switch 160. In the case that a comparator is located in the trigger detector 176, the processed external trigger signal is provided as the output of external block 150 to trigger source switch 160.

Trigger source switch 160 is connected to channel input blocks 110, 120, 130 and 140, external block 150, and analog trigger comparator 270 of integrated waveform generator 200. Trigger source switch 160 selectively outputs one of the processed input signals from the channel input blocks 110, 120, 130 and 140, the processed external trigger input signal from the external block 150, and the internal waveform trigger signal from the analog trigger comparator 270 as the trigger signal to acquisition system 170. The selection of the trigger source switch 160 may be made in response to user input, for example, via a trigger signal selection switch (not shown).

Acquisition system 170 of oscilloscope 100 comprises ADC 172, circular memory 174, trigger detector 176 and clock system 178. ADC 172 is connected to channel input blocks 110, 120, 130 and 140, and digitizes the processed input signals from the channel input blocks 110, 120, 130 and 140 and stores the digitized values in circular memory 174. ADC 172 and circular memory 174 are clocked by a clock signal provided from clock system 178. Trigger detector 176 is connected to the trigger signal output from trigger source switch 160, and detects the occurrence of a trigger event, e.g., as the rising edge of the trigger signal at a threshold of 1 volt for example. Upon detection of the trigger event, trigger detector 176 sends a signal to clock system 178 indicative of a trigger event occurrence. A predetermined time after receipt of the signal indicative of a trigger event occurrence, clock system 178 stops clocking of ADC 172 and circular memory 174. The digitized values captured in circular memory 174 at the predetermined time corresponding to the trigger event occurrence are then provided to a processing unit such as a CPU (not shown) to be displayed on display 102. The predetermined time may be user selected. Acquisition system 170 thus ensures that the part of the input signal corresponding to the trigger event is in the middle of the trace displayed by the oscilloscope.

Accordingly, the apparatus of FIG. 2 comprises both oscilloscope 100 and integrated waveform generator 200 within common housing 10, whereby the internal waveform trigger signal is internally provided directly to trigger source switch 160 of oscilloscope 100. Trigger source switch 160 has the capability upon user selection to provide either of the internal waveform trigger signal, the processed input signals and the external trigger input signal as a trigger signal for acquisition system 170 of oscilloscope 100. Internal triggering of oscilloscope 100 is thus provided without external cabling or signal splitters, and without using an external oscilloscope input. Reduction of the amplitude of the waveform generator output due to signal splitting is avoided. Also, flexibility is improved as a greater number of external oscilloscope inputs may be dedicated for measurement.

Figure 3:
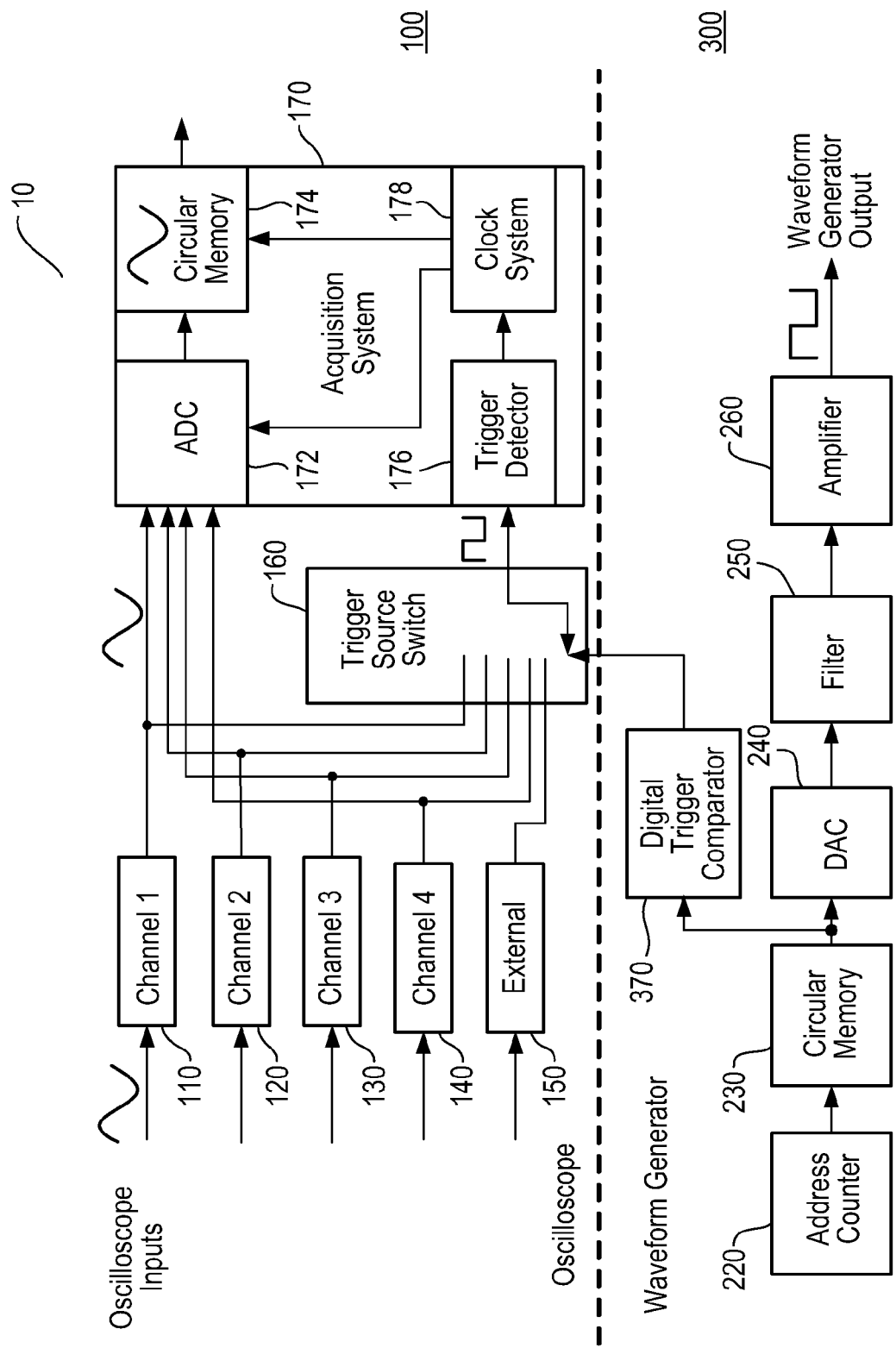
FIG. 3 is a block diagram illustrating an apparatus with an integrated DDS waveform generator including a digital trigger comparator that is coupled to digital samples prior to digital-to-analog conversion and that provides an internal waveform trigger for the oscilloscope according to a representative embodiment.

FIG. 3 is a block diagram illustrating an apparatus with an integrated DDS waveform generator including a digital trigger comparator that is coupled to digital samples prior to digital-to-analog conversion, and that provides an internal waveform trigger for the oscilloscope according to a representative embodiment. The apparatus comprises oscilloscope 100 and waveform generator 300 separated by a dashed line within common housing 10.

Referring to FIG. 3, oscilloscope 100 comprises first channel input block 110, second channel input block 120, third channel input block 130, fourth channel input block 140, external block 150, trigger source switch 160 and acquisition system 170 such as described previously with respect to FIG. 2. Further description of oscilloscope 100 as shown in FIG. 3 therefore will not be repeated for the sake of brevity.

Referring further to FIG. 3, waveform generator 300 is a DDS waveform generator including address counter 220, circular memory 230, DAC 240, filter 250, and amplifier 260 such as described previously with respect to FIG. 2, and digital trigger comparator 370. Waveform generator 300 in FIG. 3 differs from integrated waveform generator 200 in FIG. 2 by including digital trigger comparator 370 in place of analog trigger comparator 270. Digital trigger comparator 370 is connected to receive the digitized samples output from circular memory 230. Digital trigger comparator 370 monitors the digitized samples to detect a trigger event in a manner somewhat similar to analog trigger comparator 270 in FIG. 2, but however uses digital sample values instead of analog signal values. For instance, digital trigger comparator 370 may be configured to provide a trigger signal responsive to detection of rising or falling edges of the digitized samples. The generated trigger signal is output from waveform generator 300 as the internal waveform trigger signal and internally connected to oscilloscope 100.

Figure 4:
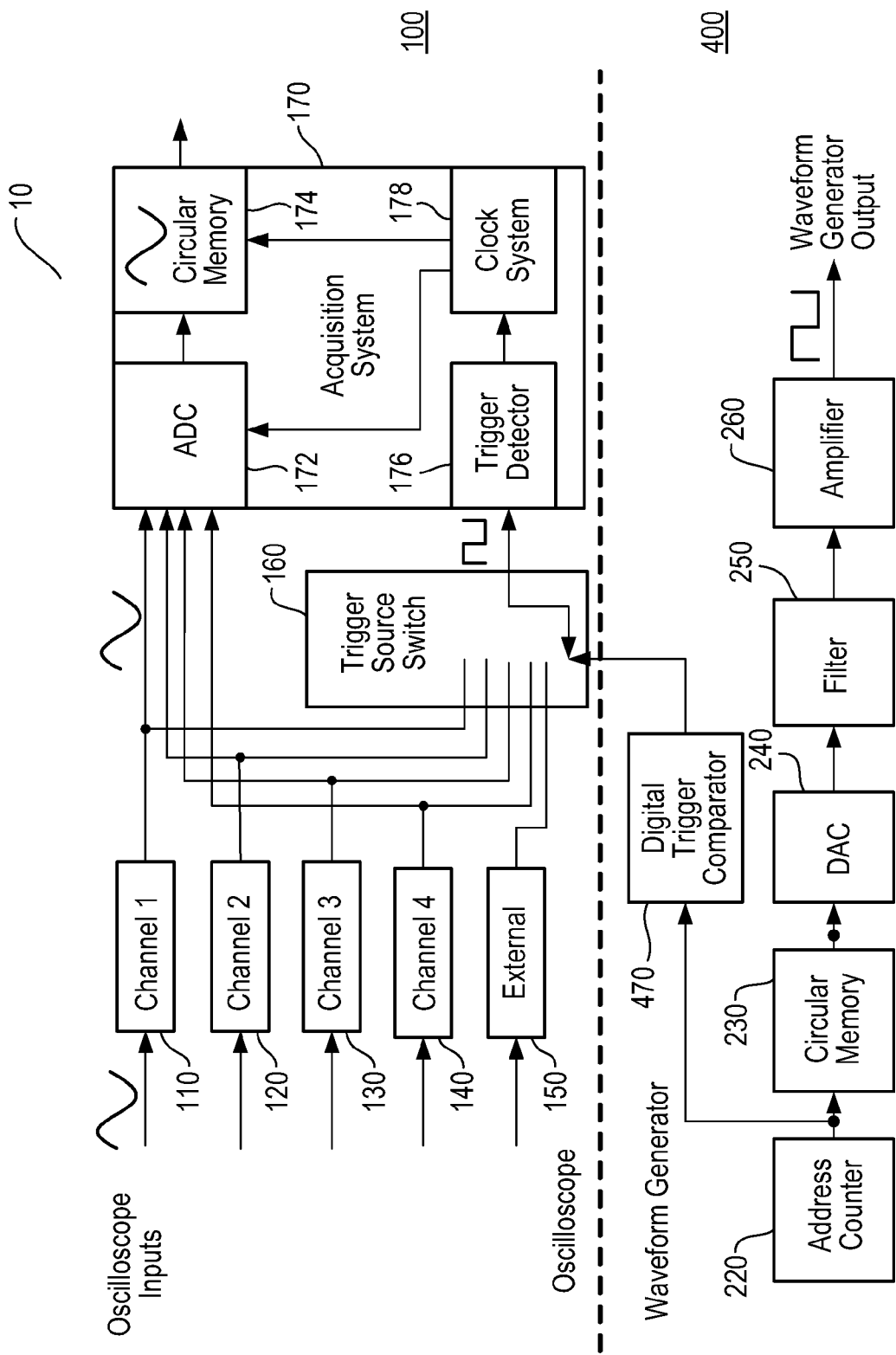
FIG. 4 is a block diagram illustrating an apparatus with an integrated DDS waveform generator including a digital trigger comparator that is coupled to an address counter output and that provides an internal waveform trigger for the oscilloscope according to a representative embodiment.

FIG. 4 is a block diagram illustrating an apparatus with an integrated DDS waveform generator including a digital trigger comparator that is coupled to an address counter output and that provides an internal waveform trigger for the oscilloscope according to a representative embodiment.

Referring to FIG. 4, oscilloscope 100 comprises first channel input block 110, second channel input block 120, third channel input block 130, fourth channel input block 140, external block 150, trigger source switch 160 and acquisition system 170 such as described previously with respect to FIG. 2. Further description of oscilloscope 100 as shown in FIG. 4 therefore will not be repeated for the sake of brevity.

Referring further to FIG. 4, waveform generator 400 is a DDS waveform generator including address counter 220, circular memory 230, DAC 240, filter 250, and amplifier 260 such as described previously with respect to FIG. 2, and digital trigger comparator 470. Waveform generator 400 in FIG. 4 differs from integrated waveform generator 200 in FIG. 2 by including digital trigger comparator 470 in place of analog trigger comparator 270. Digital trigger comparator 470 differs from digital trigger comparator 370 in FIG. 3 in that the digital trigger comparator 470 is connected to receive directly the addresses output from address counter 220 that are used to control output of the digitized samples within circular memory 230. Digital trigger comparator 470 monitors the output addresses, and outputs a trigger signal upon detecting an address that points to the desired location of the trigger event. For example, if a rising edge of the digital samples is the desired location of the trigger event and such rising edge digital sample is stored at a corresponding memory location within circular memory 230, digital trigger comparator 470 outputs the trigger signal upon detecting a digital address of the corresponding memory location output from address counter 220. The generated trigger signal is output from waveform generator 400 as the internal waveform trigger signal and internally connected to oscilloscope 100.

Figure 5:
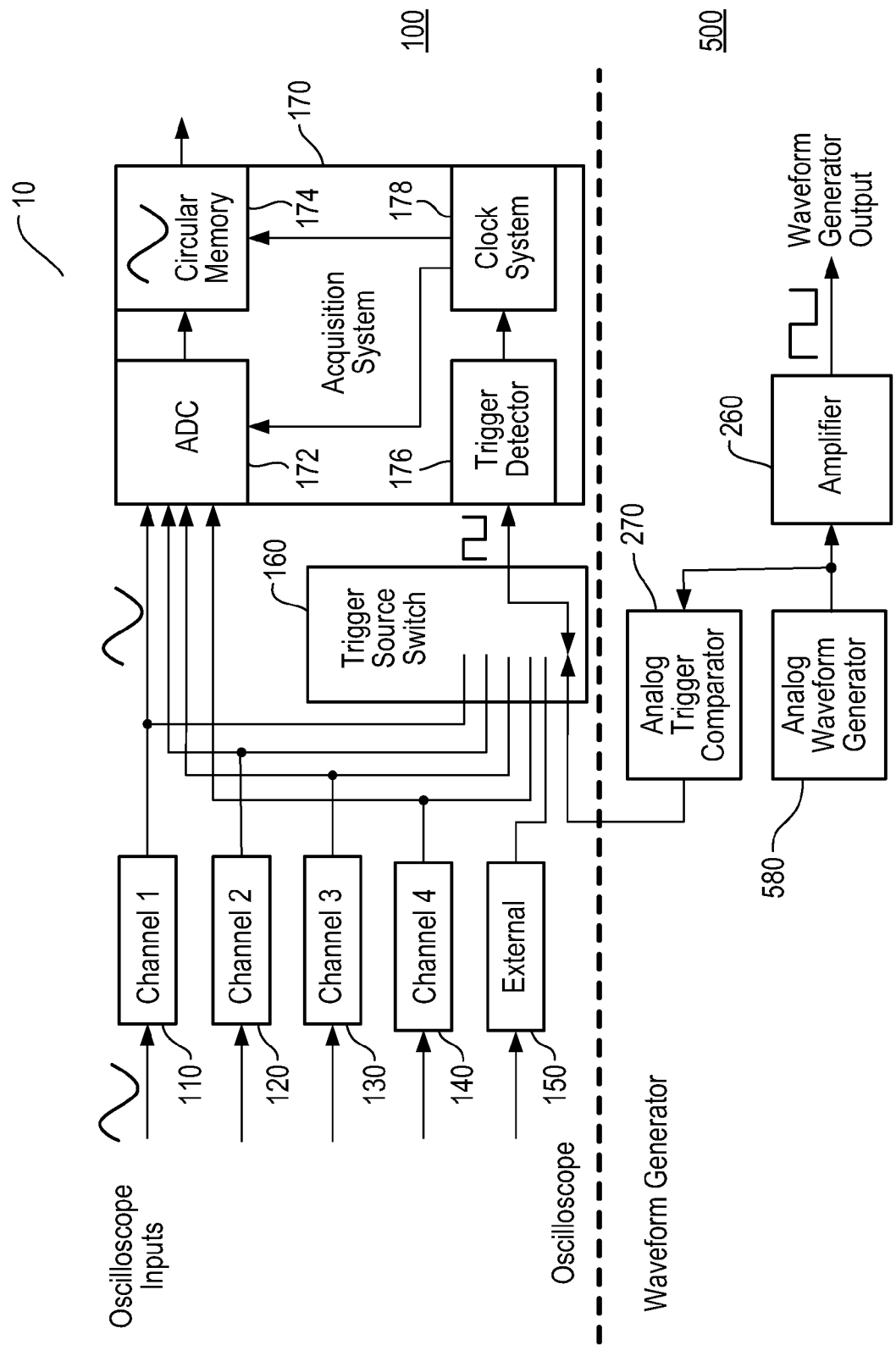
FIG. 5 is a block diagram illustrating an apparatus with an integrated analog waveform generator including an analog trigger comparator that provides an internal waveform trigger for the oscilloscope according to a representative embodiment.

FIG. 5 is a block diagram illustrating an apparatus with an integrated analog waveform generator including an analog trigger comparator that provides an internal waveform trigger for the oscilloscope according to a representative embodiment.

Referring to FIG. 5, oscilloscope 100 comprises first channel input block 110, second channel input block 120, third channel input block 130, fourth channel input block 140, external block 150, trigger source switch 160 and acquisition system 170 such as described previously with respect to FIG. 2. Further description of oscilloscope 100 as shown in FIG. 5 therefore will not be repeated for the sake of brevity.

Referring further to FIG. 5, waveform generator 500 comprises analog waveform generator 580, amplifier 260 and analog trigger comparator 270. The analog signal output from analog waveform generator 580 is amplified in amplifier 260, to provide the waveform generator output signal. Analog trigger comparator 270 is connected to analog waveform generator 580, and monitors the analog signal to detect a trigger event in a manner similar to analog trigger comparator 270 in FIG. 2. For instance, analog trigger comparator 270 may be configured to provide a trigger signal responsive to detection of rising or falling edges of the analog samples. The generated trigger signal is output from waveform generator 500 as the internal waveform trigger signal and internally connected to oscilloscope 100. The analog waveform generator 580 in FIG. 5 differs from DDS waveform generator in FIGS. 2-4, whereby the waveform generator output signal may be generated using any of many different analog methods instead of using DDS.

While specific embodiments are disclosed herein, many variations are possible, which remain within the concept and scope of the invention. For example, oscilloscope 100 as described with respect to FIG. 2 comprises digitizing of the processed input signals within channel input blocks 110, 120, 130 and 140, to provide separate trigger signals that are respectively output to trigger source switch 160. As an alternative, instead of digitizing within the channel input blocks, trigger detector 176 may digitize the trigger signals provided as output from trigger source switch 160. As another alternative, the trigger signals responsive to the processed input signals from channel input blocks 110, 120, 130 and 140 may be provided by monitoring the digital output of ADC 172 with digital comparators. Also, oscilloscope 100 is shown as triggering on one trigger input at a time as selected by trigger source switch 160. As an alternative, the triggering may be a combination of trigger signals from the channel and external blocks and the internal waveform trigger signal. Also, an embodiment can contain any number of channel and external blocks. Moreover, although the representative embodiments depict one integrated waveform generator 200, a plurality of additional waveform generators may be integrated in the common housing with the oscilloscope, and configured to provide respective waveform generator signals as outputs of the apparatus and to provide trigger signals connected internally to the oscilloscope for triggering the oscilloscope. Also, an embodiment may include an analog oscilloscope. Such variations would become clear after inspection of the specification, drawings and claims herein.

While representative embodiments are disclosed herein, one of ordinary skill in the art appreciates that many variations that are in accordance with the present teachings are possible and remain within the scope of the appended claims. The invention therefore is not to be restricted except within the scope of the appended claims.

What is claimed is:

1. An apparatus, comprising:
   an oscilloscope;
   a waveform generator integrated in a common housing with the oscilloscope, and configured to generate a waveform signal as an output of the apparatus and to generate a trigger signal responsive to the waveform signal, the trigger signal for triggering the oscilloscope; and
   a switch internally connected to the waveform generator and configured to receive the trigger signal, and connected to a channel input block and configured to receive a channel input signal,
   wherein the switch is configured to selectively provide the trigger signal and the channel input signal to trigger display of the channel input signal by the oscilloscope.

2. An apparatus as claimed in claim 1, wherein the switch is further connected to an external block to receive a signal that is external to the apparatus, and configured to selectively provide the trigger signal, the channel input signal and the signal from the external block to trigger display of the channel input signal by the oscilloscope.

3. An apparatus as claimed in claim 1, wherein the waveform signal is output to a device-under-test that is external to the apparatus, the device-under-test is responsive to the waveform signal to output a signal that is connected to the apparatus for display by the oscilloscope.

4. An apparatus as claimed in claim 1, wherein the waveform generator comprises:
   a memory configured to output digitized samples of stored waveforms;
   a converter configured to convert the digitized samples to an analog signal; and
   a comparator configured to generate the trigger signal responsive to detected trigger events in the analog signal,
   wherein the analog signal is the waveform signal.

5. An apparatus as claimed in claim 1, wherein the waveform generator comprises:
   a memory configured to output digitized samples of stored waveforms as the waveform signal; and
   a comparator configured to generate the trigger signal responsive to detected trigger events in the digitized samples.

6. An apparatus as claimed in claim 1, wherein the waveform generator generates an analog signal as the waveform signal and comprises a comparator configured to generate the trigger signal responsive to detected trigger events in the analog signal.

7. An apparatus as claimed in claim 1, further comprising at least one additional waveform generator integrated in the common housing, and configured to generate an additional waveform signal as an output of the apparatus and to generate another trigger signal connected internally to the oscilloscope for triggering the oscilloscope.

8. An apparatus as claimed in claim 1, wherein the waveform generator is configured to provide the trigger signal independently of an input signal displayed on the oscilloscope.

9. An apparatus, comprising:
   an oscilloscope;
   a waveform generator integrated in a common housing with the oscilloscope, and configured to generate a waveform signal as an output of the apparatus and to generate a trigger signal for triggering the oscilloscope; and
   a switch internally connected to the waveform generator and configured to receive the trigger signal, and connected to a channel input block and configured to receive a channel input signal,
   wherein the switch is configured to selectively provide the trigger signal and the channel input signal to trigger display of the channel input signal by the oscilloscope, and
   wherein the waveform generator comprises:
   a memory configured to output digitized samples of stored waveforms,
   a counter configured to provide addresses to control output of the digitized samples by the memory, and
   a comparator configured to generate the trigger signal responsive to the addresses provided by the counter.

10. An apparatus comprising:
    a plurality of channel input blocks configured to receive corresponding input signals;
    an acquisition system configured to display the input signals;

a waveform generator integrated in a common housing with the acquisition system, and configured to generate a waveform signal as an output of the apparatus and to generate a trigger signal responsive to the waveform signal; and a switch integrated in the common housing and connected internally to the waveform generator and the channel input blocks, and configured to selectively provide the input signals and the trigger signal to the acquisition system to trigger display of the input signals.

11. An apparatus as claimed in claim 10, wherein the waveform signal is output to a device-under-test that is external to the apparatus, the device-under-test is responsive to the waveform signal to output a signal that is connected to the channel input blocks for display by the acquisition system.

12. An apparatus as claimed in claim 10, wherein the waveform generator comprises:

a memory configured to output digitized samples of stored waveforms;

a converter configured to convert the digitized samples to an analog signal; and a comparator configured to generate the trigger signal responsive to detected trigger events in the analog signal, wherein the analog signal is the waveform signal.

13. An apparatus as claimed in claim 10, wherein the waveform generator comprises:

a memory configured to output digitized samples of stored waveforms as the waveform signal; and a comparator configured to generate the trigger signal responsive to detected trigger events in the digitized samples.

14. An apparatus as claimed in claim 10, wherein the waveform generator generates an analog signal as the waveform signal and comprises a comparator configured to generate the trigger signal responsive to detected trigger events in the analog signal.

15. An apparatus as claimed in claim 10, further comprising an external block configured to receive a signal that is external to the apparatus, and to provide the signal to the switch.

16. An apparatus as claimed in claim 10, wherein the waveform generator is configured to provide the trigger signal independently of the input signals.

17. An apparatus, comprising:

a plurality of channel input blocks configured to receive corresponding input signals;

an acquisition system configured to display the input signals;

a waveform generator integrated in a common housing with the acquisition system, and configured to generate a waveform signal as an output of the apparatus and to generate a trigger signal; and a switch integrated in the common housing and connected internally to the waveform generator and the channel input blocks, and configured to selectively provide the input signals and the trigger signal to the acquisition system to trigger display of the input signals, wherein the waveform generator comprises:

a memory configured to output digitized samples of stored waveforms, a counter configured to provide addresses to control output of the digitized samples by the memory, and a comparator configured to generate the trigger signal responsive to the addresses provided by the counter.

18. A method of triggering an apparatus having an oscilloscope and a waveform generator integrated within a common housing, the method comprising:

generating a waveform signal using the waveform generator;

generating a trigger signal responsive to the waveform signal;

internally connecting the trigger signal to the oscilloscope;

triggering display of a signal by the oscilloscope responsive to the trigger signal; and outputting the waveform signal from the apparatus.

19. A method as claimed in claim 18, further comprising:

generating a signal using a device-under-test that is external to the apparatus responsive to the waveform signal; and connecting the signal to the apparatus for display on the oscilloscope.

20. A method as claimed in claim 18, wherein the trigger signal is generated independently of the signal displayed by the oscilloscope.

* * * * *